(12) United States Patent
Akram

(10) Patent No.: US 6,337,575 B1
(45) Date of Patent: Jan. 8, 2002

(54) METHODS OF TESTING INTEGRATED CIRCUITRY, METHODS OF FORMING TESTER SUBSTRATES, AND CIRCUITRY TESTING SUBSTRATES

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/221,216

(22) Filed: Dec. 23, 1998

(51) Int. Cl.$^7$ ............................................. G01R 1/073
(52) U.S. Cl. ...................... 324/760; 324/757
(58) Field of Search ............................. 324/754, 755, 324/757, 760, 765

(56) References Cited

U.S. PATENT DOCUMENTS

| | | | |
|---|---|---|---|
| 3,596,228 A | * 7/1971 | Reed, Jr. et al. | |
| 4,975,079 A | * 12/1990 | Beaman et al. | |
| 5,007,163 A | * 4/1991 | Pope et al. | |
| 5,065,227 A | * 11/1991 | Frankeny et al. | |
| 5,302,891 A | 4/1994 | Wood et al. | 324/158 |
| 5,326,428 A | 7/1994 | Farnworth et al. | 156/654 |
| 5,374,893 A | * 12/1994 | Koopman et al. | 324/757 |
| 5,483,741 A | 1/1996 | Akram et al. | 29/846 |
| 5,523,696 A | 6/1996 | Charlton et al. | 324/758 |
| 5,523,697 A | 6/1996 | Farnworth et al. | 324/758 |
| 5,541,525 A | 7/1996 | Wood et al. | 324/755 |
| 5,592,736 A | 1/1997 | Akram et al. | 29/842 |
| 5,672,980 A | * 9/1997 | Charlton et al. | 324/754 |
| 5,691,649 A | 11/1997 | Farnworth et al. | 324/755 |
| 6,018,249 A | * 1/2000 | Akram et al. | 324/755 |

* cited by examiner

Primary Examiner—Ernest Karlsen
(74) Attorney, Agent, or Firm—Wells, St. John, Roberts, Gregory & Matkin (57) ABSTRACT

A method of testing integrated circuitry includes providing a substrate comprising integrated circuitry to be tested. The circuitry substrate to be tested has a plurality of exposed conductors in electrical connection with the integrated circuitry. In one implementation, at least some of the exposed conductors of the circuitry substrate are heated to a temperature greater than 125° C. and within at least 50% in degrees centigrade of and below the melting temperature of the exposed conductors of the circuitry substrate. In one implementation, such are heated to a temperature below their melting temperature yet effective to soften said at least some of the exposed conductors to a point enabling their deformation upon application of less than or equal to 30 grams of pressure per exposed conductor. The circuitry substrate is engaged with a tester substrate. The tester substrate has a plurality of exposed conductors at least some of which are positioned to align with exposed conductors of the circuitry substrate. The engaging occurs while the at least some conductors of the circuitry substrate are heated to temperature and comprises contacting at least some of the exposed conductors of the tester substrate with conductors of the circuitry substrate. The integrated circuitry is tested through said conductors of the circuitry substrate and the tester substrate. Methods of forming tester substrates are disclosed, as are circuitry testing substrates.

16 Claims, 5 Drawing Sheets

METHODS OF TESTING INTEGRATED CIRCUITRY, METHODS OF FORMING TESTER SUBSTRATES, AND CIRCUITRY TESTING SUBSTRATES

TECHNICAL FIELD

This invention relates to methods of testing integrated circuitry, to methods of forming tester substrates, and to circuitry testing methods.

BACKGROUND OF THE INVENTION

Integrated circuitry fabricated in the semiconductor industry is tested at various phases for operability. Such occurs both before and after singulation of individual die relative to a semiconductor wafer bearing a plurality of such die. The individual die have a plurality of exposed conductors, such as flat bond pads, which are wired in electrical connection with the integrated circuitry of the die. These bond pads ultimately might be connected with other circuitry of other substrates by metal wires which are bonded thereto. Alternately by way of example only, the exposed conductors of the individual die might comprise other projections, such as conductive balls/bumps conductively bonded with the bond pads.

During testing, the exposed conductors are engaged with a suitable tester substrate, such as a probing device or some other suitable testing device. Current is then caused to flow between the testing apparatus and the circuitry through the exposed conductors thereof for one or both of operability testing or stressing of the circuitry on the wafer. For example, low temperature testing might be conducted at room temperature up to 80° C. Further, burn-in operability cycling of the circuitry on the chip has also been conducted at temperatures at or below 125° C. An intent of the elevated temperature testing might be to verify operation of the circuitry in such environments if it is intended to operate at such elevated temperatures. Further, burn in testing is conducted in an attempt to stress the circuitry and simulate its operational life at normal operating temperatures by subjecting the wafer to the elevated temperature operability testing.

Figure 1:
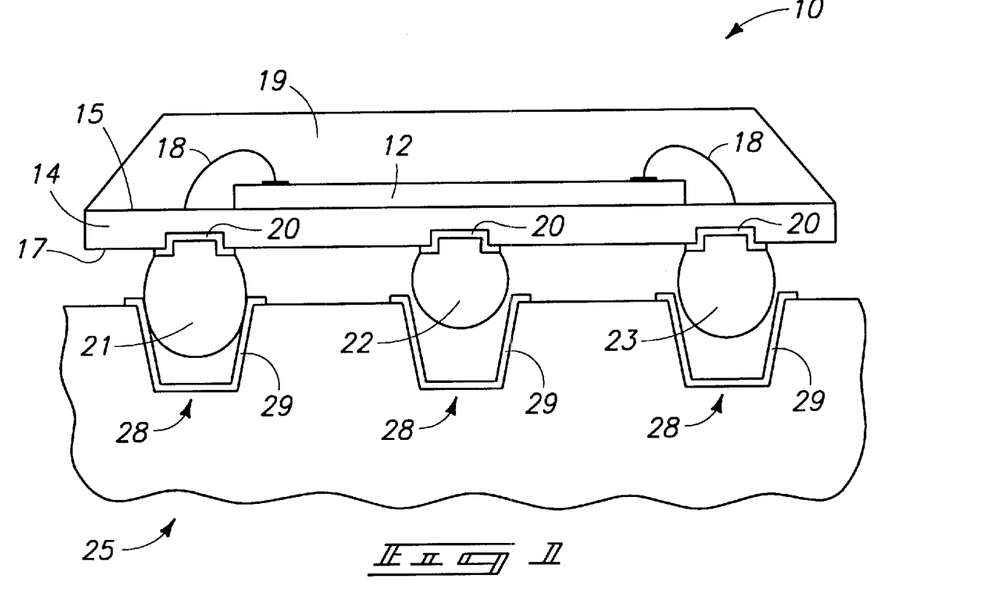
FIG. 1 is a diagrammatic sectional view of a prior art construction and process and in accordance with the invention.

One problem associated with the prior art burn-in and testing is described with respect to FIG. 1. There illustrated is a substrate 10 comprising integrated circuitry to be tested. Substrate 10 includes a monolithic chip 12 having integrated circuitry fabricated therein. Chip 12 is adhesively bonded to a printed circuit board-like substrate 14 also having conductive traces formed thereon. Substrate 14 comprises opposing surfaces 15 and 17. Chip 12 is bonded to surface 15, and includes a plurality of wire bonds 18 conductively bonded between bond pads or other connections of chip 12 and conductive traces formed on surface 15 of substrate 14. Wires 18, chip 12 and surface 15 of substrate 14 are encapsulated in a suitable cured encapsulant 19 to hermetically seal and protect the chip and bond wires. Side 17 of substrate 14 includes a plurality of conductive bond sites 20 formed in electrical connection with certain sites to which bond wires 18 electrically connect on opposing side 15. A plurality of electrically conductive ball bumps 21, 22 and 23 are conductively bonded with sites 20. Accordingly, such constitutes but one example of a plurality of exposed conductors in electrical connection with integrated circuitry, here in the form of chip 12 and substrate 14, of which burn-in and/or operability testing is to be conducted.

Certain prior art testing utilized probe pins or receptacles or jackets which contacted each of balls 21, 22 and 23 for providing the electrical connection for tests. However, the ever-increasing goal for more miniaturization in circuitry fabrication reached a point where pitch of adjacent balls fell below 1 millimeter. At around 0.5 millimeter and below, it became very difficult to both fabricate and probe substrates such as device 10 for test and burn-in cycling. One solution to this problem was to fabricate at least a portion of the testing substrate of a semiconductor wafer processed utilized photolithographic processing. Such enables precise patterning of testing locations on a testing substrate which can be closely fabricated adjacent one another to register with the exposed conductors of other substrates to be tested. One such substrate is illustrated as component 25 in FIG. 1. Substrate 25 includes a plurality of conductive receptacles 28 lined with a suitable conductor 29, and is shown diagrammatically. The reader is directed to consider possible construction disclosed in our U.S. Pat. No. 5,592,736, which is herein incorporated by reference.

It is desirable to fabricate each of the exposed conductors, such as conductive balls 21, 22 and 23, to be of substantially the same size. This would more readily assure desired contact of all of the respective balls with their registered conductive receptacles. However as processing dimensions continue to get smaller, tolerance for minor variation in exposed conductor size decreases. FIG. 1 shows an exaggerated view of each of the exposed conductors 21, 22 and 23 being of different size. Conductor 23 is shown to be within example tolerance limits for being received suitably within its registered receptacle 28 for burn-in and/or testing. However, exposed conductors 21 and 22 are shown to be too large and too small, respectively, outside of desired tolerance limits. Further, the oversize nature of exposed conductor 21, while making electrical connection with its registered receptacle 28, unfortunately precludes any desired contact in the illustrated example with exposed conductors 22 and 23. Accordingly, suitable test and/or burn-in of the integrated circuitry of substrate 10 will not occur.

SUMMARY OF THE INVENTION

The invention comprises in preferred embodiments methods of testing integrated circuitry, methods of forming tester substrates, and circuitry testing substrates. A method of testing integrated circuitry includes providing a substrate comprising integrated circuitry to be tested. The circuitry substrate to be tested has a plurality of exposed conductors in electrical connection with the integrated circuitry. In one implementation, at least some of the exposed conductors of the circuitry substrate are heated to a temperature greater than 125° C. and within at least 50% in degrees centigrade of and below the melting temperature of the exposed conductors of the circuitry substrate. In one implementation, such are heated to a temperature below their melting temperature yet effective to soften said at least some of the exposed conductors to a point enabling their deformation upon application of less than or equal to 30 grams of pressure per exposed conductor. The circuitry substrate is engaged with a tester substrate. The tester substrate has a plurality of exposed conductors at least some of which are positioned to align with exposed conductors of the circuitry substrate. The engaging occurs while the at least some conductors of the circuitry substrate are heated to temperature and comprises contacting at least some of the exposed conductors of the tester substrate with conductors of the circuitry substrate. The integrated circuitry is tested through said conductors of the circuitry substrate and the tester substrate.

In one aspect, a method of forming a tester substrate for testing circuitry having a plurality of exposed conductors includes forming a plurality of conductive receptacles at least partially received into a surface of a substrate. The receptacles are sized to receive one of the plurality of exposed conductors of circuitry being tested. A resistive receptacle heating element supported by the substrate is formed proximate at least a portion of at least some of the conductive receptacles.

In one aspect, a circuitry testing substrate comprises an outer substrate surface having a plurality of conductive receptacles formed into said surface. Resistive receptacle heating elements are supported by the substrate and are received proximate the conductive receptacles, and are spaced from conductive portions of the conductive receptacles.

Other aspects follow are contemplated.

BRIEF DESCRIPTION OF THE DRAWINGS

Preferred embodiments of the invention are described below with reference to the following accompanying drawings.

FIG. 3 is a diagrammatic sectional view of exemplary possible processing equipment utilized in accordance with the invention.

FIG. 6 is a view of the FIG. 4 wafer at a processing step subsequent to that shown by FIGS. 4 and 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
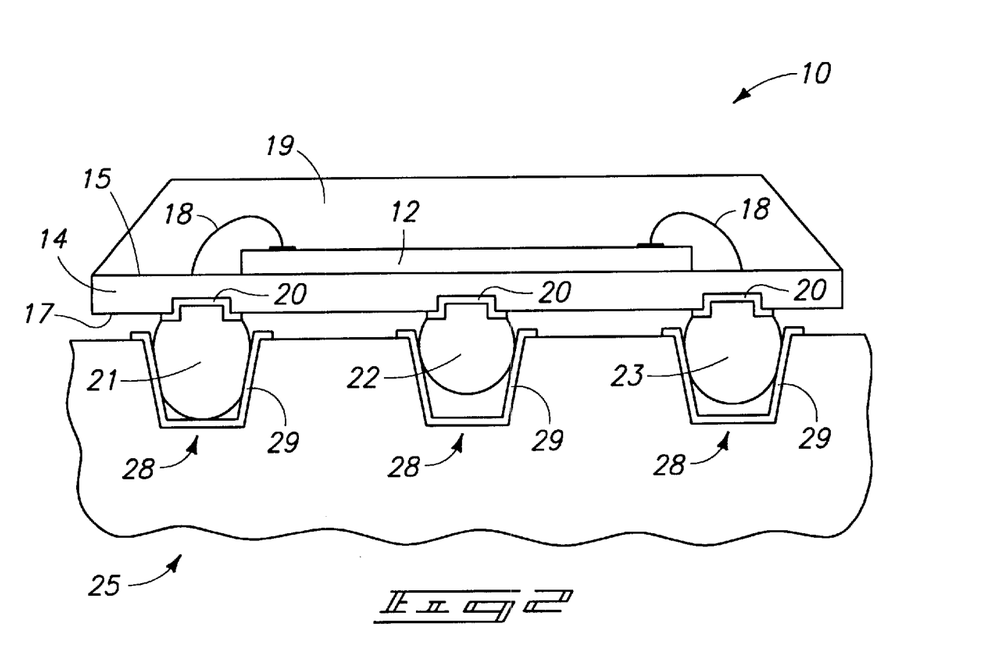
FIG. 2 is a diagrammatic sectional view involving testing integrated circuitry in accordance with the invention.

A method of testing integrated circuitry in accordance with one aspect of the invention is initially described with reference to FIGS. 1 and 2. FIG. 2 illustrates the exemplary FIG. 1 apparatus showing exemplary desirable engagement of exposed conductors 21, 22 and 23 for operability and/or burn-in testing of integrated circuitry of apparatus 10. In but one aspect of the invention, at least some of exposed conductors 21, 22 and 23 of circuitry substrate 14 are heated to a temperature of greater than 125° C. and within at least 50% in degrees centigrade of and below the melting temperature of exposed conductors 21, 22 and 23. Circuitry substrate 10 and tester substrate 25 are engaged while the at least some conductors of the circuitry substrate are heated to the temperature and in a manner which contacts at least some of the exposed conductors of tester substrate 25 with conductors of circuitry substrate 14. In the illustrated and preferred embodiment, the exposed conductors comprise conductive bumps constituting a part of a bumped circuit 12/15, with the exposed conductors of tester substrate 25 comprising conductive receptacles at least partially formed in a surface thereof. The prior art is understood to have conducted burn-in testing at a temperature of 125° C., but not wherein the heating of the exposed conductors of the circuitry under test has been to greater than 125° C. and within at least 50% in degrees centigrade of and below the melting temperature of the exposed conductors of the circuitry substrate undergoing test.

In another considered aspect of the invention, at least some of the exposed conductors of the circuitry substrate are heated to a temperature below their melting temperature, yet to a temperature effective to soften at least some of the exposed conductors to a point of enabling their deformation to better engage exposed conductors of the tester substrate. In the illustrated and preferred embodiment, the deformation is effective to receive at least the illustrated larger bump, here to be received more fully within the exemplary conductor in the form of the receptacle than it was so initially received by the engaging, such as shown in an initial state in FIG. 1. Most preferably, the temperature and deformation, in conjunction with the fabricated size of the respective exposed conductors, is to a point to achieve such deformation upon application of less than or equal to 30 grams of pressure per exposed conductor pair. More preferred is temperature, material, and device fabrication sizing to achieve deformation with a force between from about 2 grams to 20 grams, and more preferably from about 2 grams to 10 grams, per exposed conductor pair.

Preferably, the temperature to which the exposed conductors are heated is within at least 30% in degrees centigrade of the melting temperature of the exposed conductors of the circuitry substrate, and more preferably within at least 20%. Yet, the temperature is preferably not within less than 10% in degrees centigrade of the melting temperature of the exposed conductors of the circuitry substrate to avoid complete melting and possible displacement of the exposed conductor from the illustrated exemplary pads 20.

Heating to the temperature can occur prior to contact of any exposed conductor of the circuitry substrate with any exposed conductor of the tester substrate. For example, substrate 10 could be suitably heated within a furnace to a desired temperature as variously described above, most preferably suitable to soften all exposed conductors. Within a heating furnace, or externally thereof, the exposed conductors could then be brought into engagement with receptacles 28 to impart the desired deformation prior to cooling the exposed conductors to below a suitable deformation temperature. Alternately, heating to the temperature can occur after contact of and while contacting at least one exposed conductor of the circuitry substrate with at least one exposed conductor of the tester substrate. For example, engagement could occur initially as shown in FIG. 1 with both substrates being received within a furnace and heated to a desired temperature after the initial engagement. Alternately and perhaps more preferred, principal heating relative to tester substrate 25 could occur as opposed to heating both apparatus 10 and 25 of FIG. 1. Specifically by way of example only, means might be provided which are at least partially, supported by substrate 25 which provide heat effective to heat conductive receptacles 29. Examples are described below. Heating of substrate 25 as the manner by which heat is transferred to the exposed conductors of the circuitry under test might be more preferred in that complete heating of that circuitry under test can be eliminated, and only the larger balls needing deformation are initially heated by the exposed conductors of the tester substrate, as the other exposed conductors of the substrate under test are displaced from their associated receptacles.

Regardless, testing is ultimately conducted of the integrated circuitry through conductors 21, 22 and 23 of substrate 10 and exposed conductors 29 of substrate 25. Such testing might be conducted partially or in whole while at any of the above-stated temperatures, but more preferably will occur after lowering of the temperature from the maximum exposed conductor temperature. For example, such temperature lowering would most typically be of at least 20° C. and to a temperature at or below 125° C. In some instances, it might be desirable for the temperature lowering to be of at least 100° C. and to a temperature at or below 125° C. After the testing, circuitry substrate 10 would be removed from tester substrate 25. Adhesion of exposed conductors 21, 22 and 23 relative to pads 20 would be greater than relative to tester receptacles 28.

For example, exemplary exposed conductors are 63/37 lead-tin solder balls. Such material constitutes a eutectic having a melting temperature of 183° C. An exemplary preferred heating temperature for such solder balls is 150° C., which is to a temperature of within 18% in degrees centigrade of said melting temperature. Such is suitably effective to soften such solder balls to achieve the above-described preferred deformation. 95/5 lead-tin solder balls have a melting temperature of around 320° C. An exemplary preferred temperature to heat these balls to achieve the preferred deformation is from about 250° C. to about 280° C., providing a temperature within 21.9% to 12.5% of said melting temperature.

FIG. 3 illustrates diagrammatically an exemplary apparatus 30 for retaining circuitry substrate 10 and tester substrate 25. Specifically, apparatus 30 includes some form of base 32 which retains tester substrate 25. An arm 33 projects upwardly therefrom and pivotally connects with a pressure head 34 about a pivot 36. Pressure head 34 includes some suitable clamp 38 which appropriately engages with base 32 to apply a suitable clamping and retaining force of circuitry substrate 10 relative to tester substrate 25. A spring or elastomer (not shown) can be placed between substrate 14 and pressure head 34, if desired.

Figure 4:
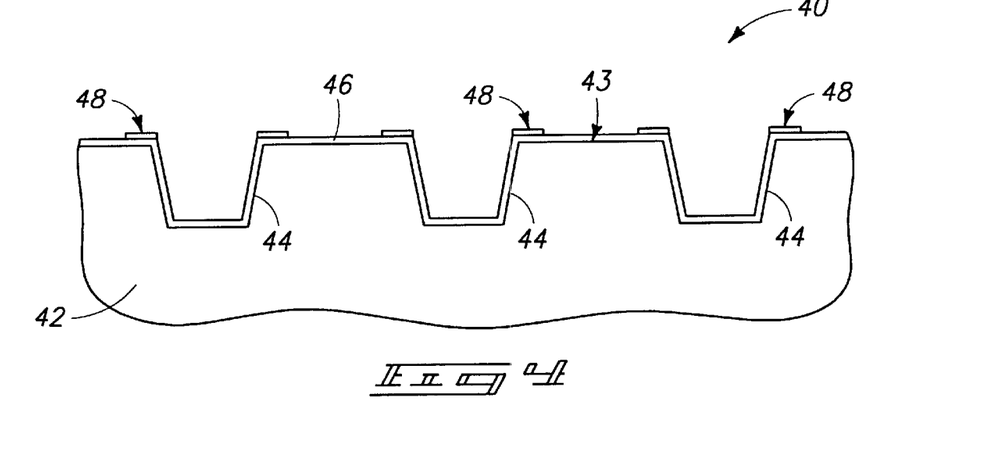
FIG. 4 is a diagrammatic sectional view of a semiconductor wafer fragment at one processing step in accordance with an aspect of the invention.
Figure 5:
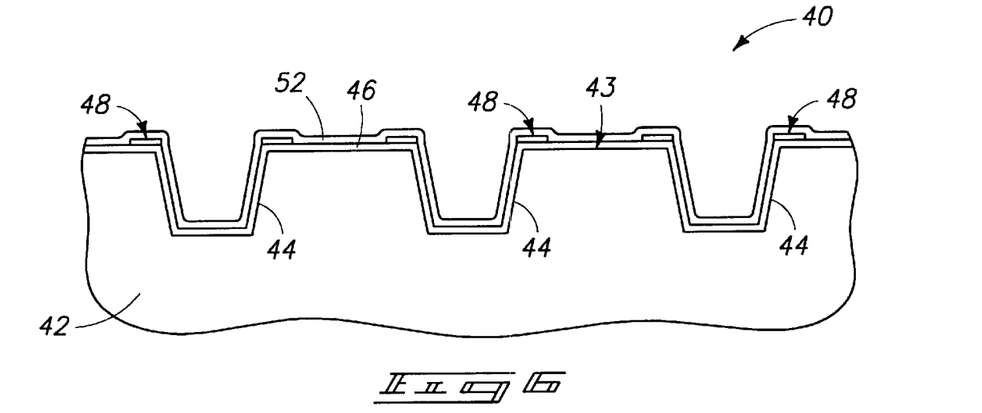
FIG. 5 is a top plan view of the FIG. 4 wafer.

An exemplary and preferred tester substrate and method of forming such are initially described with reference to FIGS. 4–7. Referring first to FIGS. 4 and 5, a tester substrate 40 comprises a bulk monocrystalline silicon substrate 42 having an outer surface 43. Indentations or receptacles 44 are formed into substrate 42 through surface 43. Indentations 44 are patterned to register or align with exposed conductors of the substrates to undergo test/burn-in. Exemplary dimensions for indentations 44 are 350 microns by 350 microns and 100 microns deep, and dependent upon dimensions of ball/conductors 21, 22 and 23. An insulating dielectric layer 46, such as $SiO_2$, is deposited or thermally grown over substrate 42 and within indentations 44. A conductive resistance heating layer is thereafter deposited and patterned (i.e., using photolithography) to form a plurality of heating elements 48 which are supported by substrate 42 and received proximate indentations 44. More specifically, heating elements 48 preferably comprise a continuous line fabricated over oxide layer 46 to line at least three sides of most of depressions 44. An example material for heating elements 48 is polysilicon conductively doped with from $1 \times 10^{15}$ to $1 \times 10^{18}$ atoms/cm$^3$ conductivity enhancing impurity and deposited to a thickness of from 0.5 micron to 2 microns thick.

FIG. 5 illustrates such conductive lines extending to a pair of bond pads 50 which could electrically connect with current-supplying circuitry for causing current to flow and heating to occur relative to heating elements 48. Further and alternately, circuitry might be fabricated largely entirely relative to substrate 42 such that only a suitable power source must be provided relative to such circuitry for energizing heater elements 48.

Referring to FIG. 6, an insulating dielectric layer 52, such as $SiO_2$, is deposited over the substrate and heater elements 48.

Figure 7:
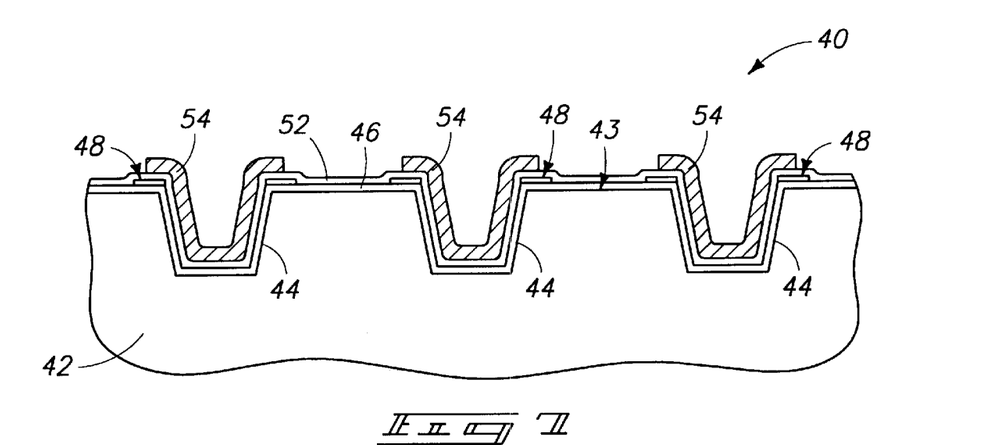
FIG. 7 is a view of the FIG. 4 wafer at a processing step subsequent to that shown by FIG. 6.

Referring to FIG. 7, a suitable conductor, such as metal, is deposited over the substrate and patterned as shown to complete the fabrication of conductive receptacles 54. Such are shown at least is partially received into surface 43 of substrate 42, with each such receptacle being sized to receive one of a plurality of exposed conductors of the circuitry to undergo a test. As shown, a peripheral portion of the respective receptacles 54 overlies a portion of the respective heating elements 48. Further, the respective receptacle heating elements are supported by the substrate proximate at least a portion of at least some of the conductive receptacles. Further, at least a portion of the respective conductive receptacles 54 (i.e., indentations 44) are formed prior to forming the respective heating elements 48. Further, at least a portion of the respective conductive receptacles 54 (i.e., the conductive layer thereof) is formed after forming the respective heating elements 48. Further, the respective resistive receptacle heating elements 48 line only a portion of the respective receptacles peripheries, as is inherent from a view of FIG. 5. Further, the resistive heating elements are spaced and electrically isolated from conductive receptacles 54, here in this example by intervening oxide layer 52.

The above-described exemplary resistive heating elements comprise but one example of a portion of means which are supported by a substrate for heating conductive receptacles. Further, such means does not comprise the conductive receptacles themselves. Alternate means are of course contemplated in accordance with the invention and accompanying claims. By way of example only, circuitry could be provided supported by substrate 42, or in another manner, which suitable energizes exposed conductors (such as receptacles, like receptacles 54) to heat exposed conductors of the circuitry under test received thereby suitable to achieve temperatures disclosed and claimed in this document. Such circuitry might include suitable switching or other circuitry enabling the receptacles to both function as conductive test contacts and heat-imparting devices separately or together.

Figure 8:
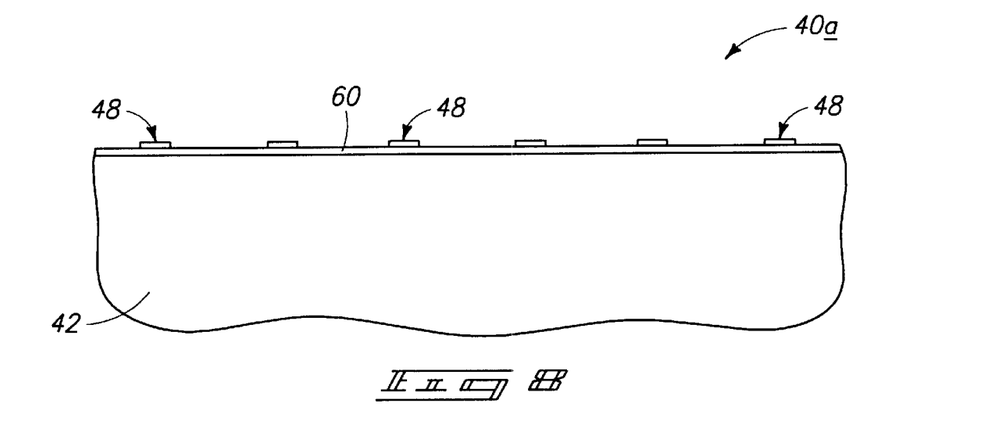
FIG. 8 is a diagrammatic sectional view of an alternate embodiment semiconductor wafer fragment at a processing step in accordance with an aspect of the invention.
Figure 9:
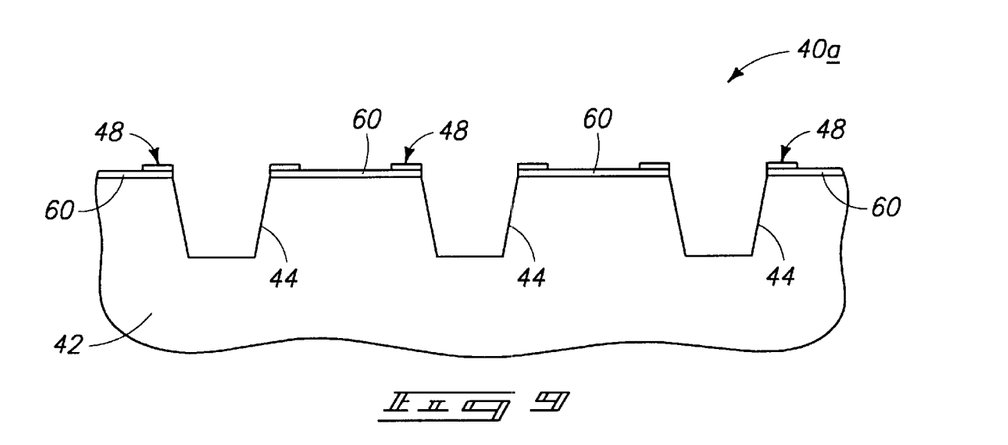
FIG. 9 is a view of the FIG. 8 wafer at a processing step subsequent to that shown by FIG. 8.
Figure 10:
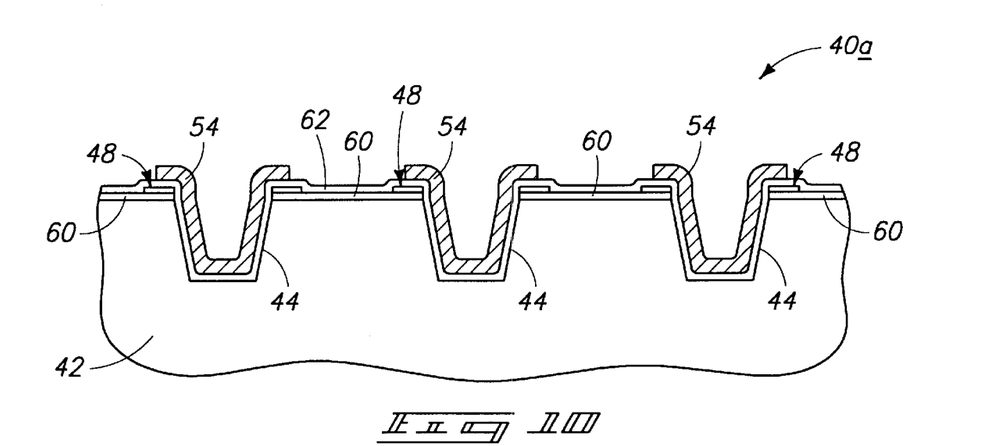
FIG. 10 is a view of the FIG. 8 wafer at a processing step subsequent to that shown by FIG. 9.

FIGS. 8–10 illustrate alternate processing for fabrication of a testing substrate. Like numerals from the embodiment of FIGS. 4–7 are utilized where appropriate, with differences being indicated with the suffix "a" or with different numerals.

Referring to FIG. 8, tester substrate 40a comprises an exemplary bulk monocrystalline silicon substrate 42 having an insulating dielectric layer 60 fabricated thereover. An exemplary thickness is from 1 micron to 6 microns. Resistive heating elements 48 are formed thereover.

Referring to FIG. 9, substrate 40a has been suitably patterned and etched to produce the desired depressions or receptacles 44.

Referring to FIG. 10, an insulating dielectric layer 62 is deposited over the substrate and resistive heating elements 48 to within depressions 44. Subsequently, a conductive layer is deposited and patterned to form the illustrated conductive receptacles 54.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of testing integrated circuitry comprising:

providing a substrate comprising integrated circuitry to be tested, the circuitry substrate having a plurality of exposed conductors in electrical connection with the integrated circuitry;

heating at least some of the exposed conductors of the circuitry substrate to a temperature greater than 125° C. and within at least 50% in degrees centigrade of and below the melting temperature of the exposed conductors of the circuitry substrate;

engaging the circuitry substrate with a tester substrate, the tester substrate having a plurality of exposed conductors at least some of which are positioned to align with exposed conductors of the circuitry substrate, the engaging occurring while the at least some conductors of the circuitry substrate are heated to the temperature and comprising contacting at least some of the exposed conductors of the tester substrate with conductors of the circuitry substrate, the heated engaging deforming at least one of the exposed conductors of the circuitry substrate;

after the engaging, testing the integrated circuitry through said conductors of the circuitry substrate and the tester substrate, and after the testing, disengaging the circuitry substrate and tester substrate from one another.

2. The method of claim 1 wherein the exposed conductors of the circuitry substrate comprise ball bumps.

3. The method of claim 2 wherein the pitch of the two closest of said ball bumps is less than 0.6 mm.

4. The method of claim 1 wherein the temperature is within at least 30% in degrees centigrade of the melting temperature of the exposed conductors of the circuitry substrate.

5. The method of claim 1 wherein the temperature is within at least 20% in degrees centigrade of the melting temperature of the exposed conductors of the circuitry substrate.

6. The method of claim 1 wherein the temperature is not within less than 10% in degrees centigrade of the melting temperature of the exposed conductors of the circuitry substrate.

7. The method of claim 1 wherein the heating to the temperature occurs prior to contact of any exposed conductor of the circuitry substrate with any exposed conductor of the tester substrate.

8. The method of claim 1 wherein the heating to the temperature occurs after contact of and while contacting at least one exposed conductor of the circuitry substrate with at least one exposed conductor of the tester substrate.

9. The method of claim 1 wherein the testing occurs after lowering temperature of the at least some conductors of the circuitry substrate from said temperature to a lower temperature.

10. The method of claim 1 wherein the testing occurs after lowering temperature of the at least some conductors of the circuitry substrate from said temperature to a lower temperature at least 20° C. lower than said temperature.

11. The method of claim 1 wherein the testing occurs after lowering temperature of the at least some conductors of the circuitry substrate from said temperature to a lower temperature at least 100° C. lower than said temperature.

12. The method of claim 1 wherein the testing occurs after lowering temperature of the at least some conductors of the circuitry substrate from said temperature to a lower temperature at or below 125° C.

13. The method of claim 1 wherein the exposed conductors of the tester substrate comprise receptacles within which at least some of the exposed conductors of the circuitry substrate are received during the engaging.

14. The method of claim 1 wherein the exposed conductors of the tester substrate comprise indentations formed into an outer surface of the tester substrate, the engaging comprising positioning at least some of the plurality of exposed conductors of the circuitry substrate within the tester substrate indentations.

15. The method of claim 1 wherein the engaging starts by contacting less than all exposed conductors of the circuitry substrate with the exposed conductors of the tester substrate, and the heating to said temperature of individual exposed conductors of the circuitry substrate occurs after contact of respective individual of the exposed conductors of the circuitry substrate with individual tester substrate exposed conductors.

16. The method of claim 1 wherein the exposed conductors of the tester substrate comprise indentations formed into an outer surface of the tester substrate, the heating comprising heating the indentations at least to said temperature and heating individual exposed conductors to said temperature resulting from contact of respective individual of the exposed conductors of the circuitry substrate with the heated indentations.

* * * * *

UNITED STATES PATENT AND TRADEMARK OFFICE
CERTIFICATE OF CORRECTION

PATENT NO. : 6,337,575 B1  
DATED : January 8, 2002  
INVENTOR(S) : Salman Akram It is certified that error appears in the above-identified patent and that said Letters Patent is hereby corrected as shown below:

<u>Title page,</u>
Item [54], Title, replace "METHODS OF TESTING INTEGRATED CIRCUITRY, METHODS OF FORMING TESTER SUBSTRATES, AND CIRCUITRY TESTING SUBSTRATE" with -- METHODS OF TESTING INTEGRATED CIRCUITRY --

Signed and Sealed this

First Day of October, 2002

Attest:

Attesting Officer

JAMES E. ROGAN
*Director of the United States Patent and Trademark Office*